United States Patent [19]
Jairazbhoy et al.

[11] Patent Number: 5,639,013
[45] Date of Patent: Jun. 17, 1997

[54] OPTIMALLY SHAPED SOLDER JOINTS FOR IMPROVED RELIABILITY AND SPACE SAVINGS

[75] Inventors: Vivek Amir Jairazbhoy, Farmington Hills; Richard Keith McMillan, II, Dearborn, both of Mich.

[73] Assignee: Ford Motor Company, Dearborn, Mich.

[21] Appl. No.: 363,768

[22] Filed: Dec. 23, 1994

[51] Int. Cl.$^6$ ................................................ H05K 3/34
[52] U.S. Cl. ................ 228/248.1; 228/118; 228/180.21
[58] Field of Search .................... 228/180.21, 180.22, 228/248.1, 118, 216

[56] References Cited

U.S. PATENT DOCUMENTS

| | | | |
|---|---|---|---|
| 4,605,153 | 8/1986 | Van Den Brekel et al. | 228/56.3 |
| 4,605,987 | 8/1986 | Allensworth | 361/768 |
| 4,635,093 | 1/1987 | Ross | 361/761 |
| 4,836,435 | 6/1989 | Napp et al. | 228/180.22 |
| 4,870,225 | 9/1989 | Anao et al. | 228/180.21 |
| 4,955,132 | 9/1990 | Ozawa | 29/840 |
| 5,062,567 | 11/1991 | Nishihara et al. | 228/180.21 |
| 5,294,039 | 3/1994 | Pai et al. | 228/254 |
| 5,311,405 | 5/1994 | Tribbey et al. | 361/767 |

FOREIGN PATENT DOCUMENTS

| | | |
|---|---|---|
| 0 395 488 | 10/1990 | France . |
| 0 631 461 | 12/1994 | France . |
| 1276696 | 7/1989 | Japan . |
| 5226819 | 3/1993 | Japan . |

OTHER PUBLICATIONS

"Acceptability of Electronic Assemblies".

"Surface Mount Design And Land Pattern Standard".

New Electronics, vol. 18, No. 21, Oct. 1985, D. Boswell, "Practical Solutions to Surface Mount Problems", p. 41, left column; Figure 4.

Patent Abstracts of Japan, vol. 14, No. 45, (e–0880), AB date 26 Jan. 1990.

Patent Abstracts of Japan, vol. 17, No. 676,(e–1475), AB date 13 Dec. 1993.

*Primary Examiner*—Samuel M. Heinrich
*Attorney, Agent, or Firm*—Joseph W. Malleck

[57] ABSTRACT

A method for improving the reliability of solder joints is disclosed for use in reflow soldering. In the method, a predetermined amount of solder is applied to at least two solder pads on a circuit board and a component having at least two terminals is fixed in relation to the solder pads. The solder is melted so that the component floats to a predetermined height above the solder pads and, when solidified, the solder fillet formed at each terminal holds the component a predetermined height above the circuit board and forms a convex shape.

6 Claims, 2 Drawing Sheets

5,639,013

OPTIMALLY SHAPED SOLDER JOINTS FOR IMPROVED RELIABILITY AND SPACE SAVINGS

BACKGROUND OF THE INVENTION

The invention relates generally to reflow soldering and more specifically to a method for improving the reliability of solder joints for surface mount devices.

The size and shape of solder joints for surface mount components are typically used as indicators of the reliability of the solder joint. It is common in many engineering standards such as IPC-A-610A for a solder joint having a concave cross section to be the only acceptable solder joint shape. As an example, U.S. Pat. No. 5,062,567 describes a convex solder joint as unacceptable for a component having a lead designed to encourage a concave shape at the lead.

In surface mount design, the solder pedestal (i.e., the area of the solder joint between the bottom of the component terminal and the solder pad) is recognized as an area where relatively high stresses arise under operating conditions. Stresses in this area contribute to the failure of the joints, reducing product reliability. One method of reducing these stresses is to prevent solder from entering the area between the component and the pad. However, such designs are often difficult to manufacture consistently and are often costly.

Solder joints produced under industry-standard design and process conditions typically have a concave cross-section after reflow. Concave solder joints indicate that a net downward force acted on the component during reflow. This downward force causes the component to sink in the molten solder to a position close to the surface of the circuit board, resulting in a low pedestal height. One disadvantage of a low pedestal height is that stresses in the pedestal are larger for lower pedestal heights.

It is desirable to provide a reliable solder joint having a controlled shape which is relatively easy to manufacture, especially for larger components. In addition, it is desirable to increase the component density on a circuit board.

SUMMARY OF THE INVENTION

One object of the present invention is to form solder joints which exhibit reduced stress under operating conditions. To achieve this, a convex solder joint is formed which has an increased pedestal height. In doing so, the variety of components that will meet reliability requirements is advantageously increased leading to increased design flexibility for the reflow soldering process. In addition, the amount of circuit board area required is decreased, allowing increased component densities.

The present invention includes applying a predetermined amount of solder to at least two solder pads on a circuit board. A component having at least two terminals is fixed in relation to the solder pads. The solder is melted so that the component floats to a predetermined height above the solder pads and when solidified, the solder fillet formed at each terminal holds the component a predetermined height above the circuit board and forms a convex shape.

DETAILED DESCRIPTION OF THE PREFERRED EMBODIMENT

Figure 1:
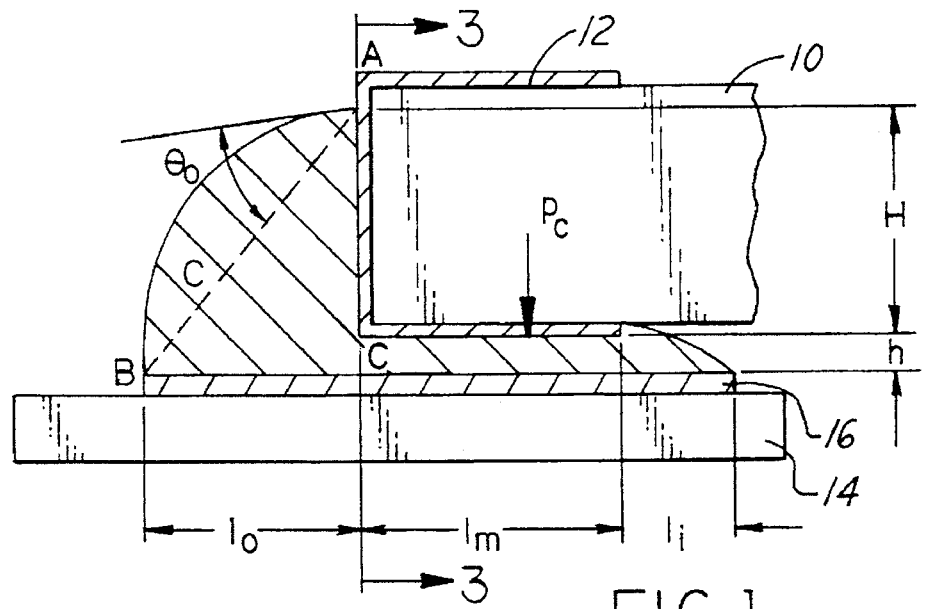
FIG. 1 is a longitudinal cross sectional view of a component soldered to a solder pad of a circuit board according to the present invention.

Referring to FIG. 1, the left side of a surface mount component 10 having a metal terminal 12 is shown for illustration purposes having a top surface, end surface and bottom surface. It is understood that not all components have all the surfaces shown. Both the left side and right side are symmetrical, so the description of one side is equally applicable to the other side. A circuit board 14 has a solder pad 16 formed thereon in a conventional manner. Terminal 12 is electrically and mechanically fastened to solder pad 16 using a solder fillet 18.

An amount of solder 18 is deposited onto the surface of solder pad 16 so that, during reflow soldering, component 10 will rise above solder pad 16 by a predetermined pedestal height h, which results in a convex shaped solder joint. Reflow occurs when component and circuit board are heated to a predetermined temperature so that the solder changes to a molten state. When the solder resolidifies, the component is electrically and mechanically connected to solder pad 16.

Minimum Solder Requirements

To obtain the desired results of a floating component with a convex solder joint, an amount of solder at least equal to a threshold amount must be used. Conventional screen printing of solder with conventional sizing for a particular pad size for a component does not result in the structure required by this invention. Either the pad size must be modified or the solder quantity must be modified versus the prior art in order to achieve the floating components of this invention. The following are conditions in terms of a minimum solder requirement for any particular pad size that will result in the desired convex joint formation. As a consequence of the calculated minimum volume of solder, a positive force balance is created on the component at an original zero pedestal height causing the component to "float" to an equilibrium non-zero height. The relationships are most accurate for low (height less than 50 mils), wide (nearly 2-dimensional) components, but also provide good guidelines for other components. A solder volume 30% greater than the calculated volume is recommended.

The following is a summary of the variables used in the calculation of the solder quantities to use:

A,B=Temporary variables defined in Equations 4 and 5
$c_o$=Hypotenuse of triangle ABC in FIG. 1
h=Pedestal height
H=Height of solder on end terminal 12 from the bottom of component 10 (usually the same as the height of component 10 for convex solder joints)
$l_i$=Inward extension of solder pad 16 beyond terminal 12
$l_o$=Outward extension of solder pad 16 beyond terminal 12

$l_m$=Length of the bottom surface of terminal 12
$V_f$=Volume of solder fillet
W=Weight of component 10
w=Width of component 10
$\theta_o$=Angle between a line tangential to the solder fillet where the solder fillet touches the pad and the face of the end of terminal 12
$\sigma$=Surface tension
$p_c$=Pressure on solder fillet 18 due to weight of component 10 which is given by the formula 0.5 $W/(wl_m)$ Convex Joint Formation The quantity of molten solder above which a convex fillet is created is given by $$V_f = 0.5 \, w \, H \, l_o \quad (1)$$

Positive Force Balance

The minimum volume of solder producing a positive force balance on the component at zero pedestal height, i.e. causing the component to "float" to an equilibrium non-zero height is given by:

$$V_f = 0.25w\{\theta_o(c_o/\sin\theta_o)^2 - c_o^2\cot\theta_o + 2 H l_o\} \quad (2)$$

where $$\theta_o = \frac{\arcsin - AB \pm \sqrt{\{(AB)^2 - (A^2 + B^2)(B^2 - H^2)\}}}{(A^2 + B^2)} \quad (3)$$

$$A = - (l_t + l_o + 2 l_m) \quad (4)$$
and
$$B = (p_c l_m c_o)/\sigma \quad (5)$$

Selection of the appropriate root is guided by the fact that $\theta_o$ is a small positive angle (generally less than 30°). For convenience during pad design, approximate forms of equation (3) accurate for positive $\theta_o<30°$ can be derived. The simplest and least accurate is as follows:

$$\theta_o = -(B+H)/A \quad (6)$$

The following is a second order accurate result of intermediate accuracy:

$$\theta_o = [A \pm \sqrt{\{A^2 + 2H(H+B)\}}]/H \quad (7)$$

Equation (6) is generally adequate for $\theta_o<25°$, while equation (7) usually gives adequate results for $\theta_o<35°$.

An example of the representative accuracy of equations (3), (6), and (7) for a typical positive force balance calculation follows:

TABLE I

| Formula | θ° | Error |
|---|---|---|
| Equation (3) | 22.13° | — |
| Equation (6) | 23.20° | 4.8% |
| Equation (7) | 22.17° | 0.2% |
| Numerical Solution | 22.59° | 2.1% |

EXAMPLES

Figure 2:
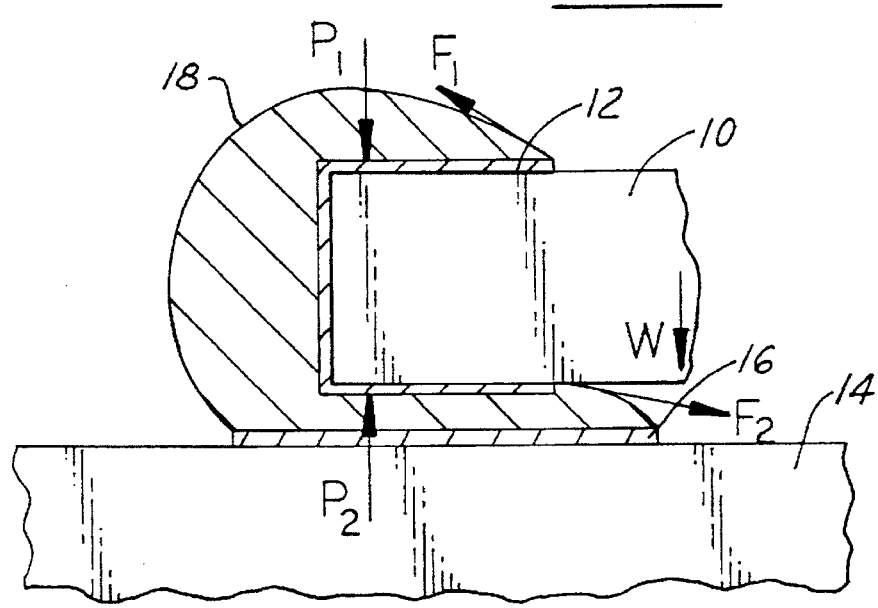
FIG. 2 is a longitudinal cross sectional view of an alternative embodiment of the invention having a component soldered to a solder pad of a circuit board according to the present invention.

The following examples illustrate the method to design and manufacture a convex "component-floating joint" with a predetermined pedestal height and to determine if a joint of given volume and pad geometry will produce such a joint. Note that although the minimum solder volume required to float the component may provide adequate pedestal height for good reliability, about 30% above the minimum is recommended for robustness. In part, the excess solder is recommended because of the possibility that the solder may wet the top of the terminal, altering the force balance slightly and partially consuming the solder (as shown in FIG. 2). For illustration purposes only, screen printing paste (50% solder by volume) to a height of 10 mils over the pad area will be taken as the "typical" mode of solder dispensing since this is the most common in the industry.

Example 1

In this first example, a "typical" conventional pad geometry for a 2512 chip resistor (a relatively large component) from the viewpoint of "floating" and "pedestal height" is analyzed. To illustrate that the quantity of solder required to float the chip far exceeds that dispensed in a "typical" screen printing process. The size of pad is then found that floats the chip within the constraints of screen printing so that the pad design conforms to the criterion—"30% above the minimum floating requirement" within screen printing constraints.

Procedure:

The following are typical data for the above mentioned component.

DATA:

$l_0$=63 mils $l_m$=20 mils $l_t$=5 mils
H=20 mils w=120 mils $p_c$=120.9N/m²
W=3.7E-5 Kgf $\sigma$=0.49N/m From equations (2) and (3) (computing A and B from equations (4) and (5)):

$\theta_0$=15.1°

$V_f$(min)=9.876E4 mils³

The paste quantity which is applied in a typical screen printing process is determined by the following equation:

Paste quantity applied=(Pad Area) (Paste Height) (% Solder)
$V_f$(applied)=5.28E4 mils³

The typical screen printing deposits only about half the solder required to "float" the component. To obtain a convex joint and pedestal height the outward pad extension $l_0$ is shortened such that $l_0$=15 mils while leaving the other parameters the same, equations (2), (3), (4), and (5) yield:

$\theta_0$=22.6°

$V_f$(min)=2.330E4 mils³

The amount of solder applied to the shortened pad during screen printing is:

Paste quantity applied=(Pad area) (Paste Height) (% Solder)
$V_f$(applied)=2.4E4 mils³

With the modification to the length of the pad, screen printing deposits a solder volume just adequate to "float" the component but not raise the component to a sufficient height above solder pad 16. Solder joints with solder volumes greater than $V_f$(min) will float the component. The resulting pedestal height in practice is higher than in the unmodified case.

The solder joint can be modified by altering the outward pad extension $l_{10}$ such that $l_o$=10 mils while leaving the other parameters the same, equations (2), (3), (4), and (5) yield:

$\theta_o$=24.4°

$V_f$(min)=1.637E4 mils$^3$

The paste quantity which is applied in a typical screen printing process is determined by the following equation:

Paste quantity applied=(Pad Area) (Paste Height) (% Solder)
$V_f$(applied)=2.1E4 mils$^3$ In this case, screen printing can be used to deposit nearly 30% more solder than the minimum required to "float" the component. This pad design and solder volume combination falls within the recommended "30% excess solder" guidelines and satisfies screen printing constraints. The solder volume is greater than $V_f$(min). The resulting pedestal height in practice is expected to be higher than when the outward pad extension is longer.

In this example, a conventional pad geometry for a 0402 chip resistor (a relatively small component) from the viewpoint of "floating" and "pedestal height" is analyzed. The solder pad is modified to show that the amount of solder required to float the chip can be dispensed in a screen printing process for the particular pad size.

A pad design (altering the inward pad extension $l_i$) is found that conforms to the criterion—"30% above the minimum floating requirement" within screen printing constraints.

DATA:

$l_o$=10 mils $l_m$=10 mils $l_i$=0 mils

H=14 mils w=20 mils $p_c$=39.2N/m$^2$

W=1E-6 Kgf σ=0.49N/m

From equations (2) and (3) (computing A and B from equations (4) and (5)):

$\theta_o$=28.5°

$V_f$(min)=1.909E3 mils$^3$

Paste quantity applied=(Pad Area) (Paste Height) (% Solder)
$V_f$(applied)=2.0E3 mils$^3$ In this case, screen printing was used to deposit a solder volume just adequate to "float" the component. By now altering the inward pad extension $l_i$ such that $l_i$=5 mils while leaving the other parameters the same, equations (2), (3), (4), and (5) yield:

$\theta_o$=24.2°

$V_f$(min)=1.827E3 mils$^3$

The paste quantity which is applied in a typical screen printing process is determined by the following equation:

Paste quantity applied=(Pad Area) (Paste Height) (% Solder)
$V_f$(applied)=2.5E3 mils$^3$ In this case, screen printing was used to deposit 30% more solder than the minimum required to "float" the component. This pad design and solder volume combination falls within the recommended "30% excess solder" guidelines and satisfies screen printing constraints. The resulting pedestal height is higher than in the previous example.

Referring now to FIG. 2, the amount of solder can be modified and still achieve desired results. An amount of solder can be sufficiently large to extend to the top surface of terminal 12 while still providing a floating joint. $F_1$ and $F_2$ represent the surface tension force on the component from the molten solder. $P_1$ and $P_2$ represent the net pressures on component 10. The magnitude of $P_2$ is greater than $P_1$ providing a net upward pressure, i.e., a buoyant force.

Figure 3:
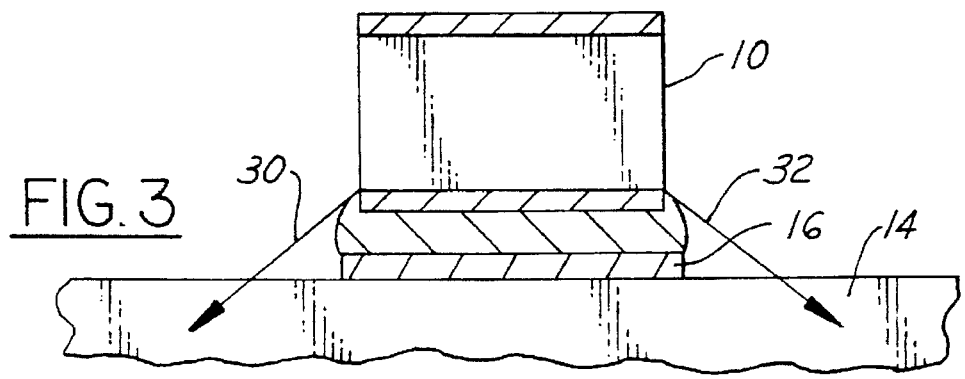
FIG. 3 is a lateral cross sectional view of a component soldered to a solder pad of a circuit board according to another alternative embodiment.

Referring now to FIG. 3, a cross sectional end view of a terminal is shown. Forces represented by arrows 30 and 32 are balanced so that component 10 is balanced laterally on solder pad 16. Balanced forces 30 and 32 help keep component 10 centered on solder pad 16 while the circuit board undergoes the reflow process.

Figure 4:
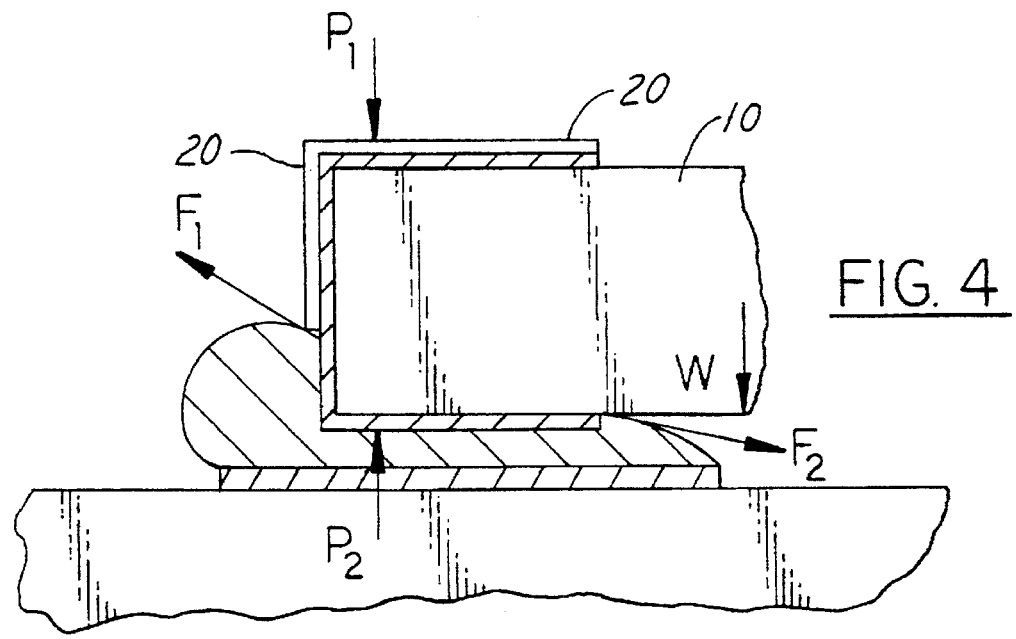
FIG. 4 is a longitudinal cross sectional view of a component soldered to a solder pad of a circuit board according to the present invention.

Referring now to FIG. 4, the terminal geometry is reduced by affixing a non-wetting surface 20 on terminal 12 to reduce the area where solder will adhere. Non-wetting surface 20 may comprise teflon or other suitable solder resistant material and may be affixed to the top surface of component 10 and a portion of terminal 12.

Figure 5:
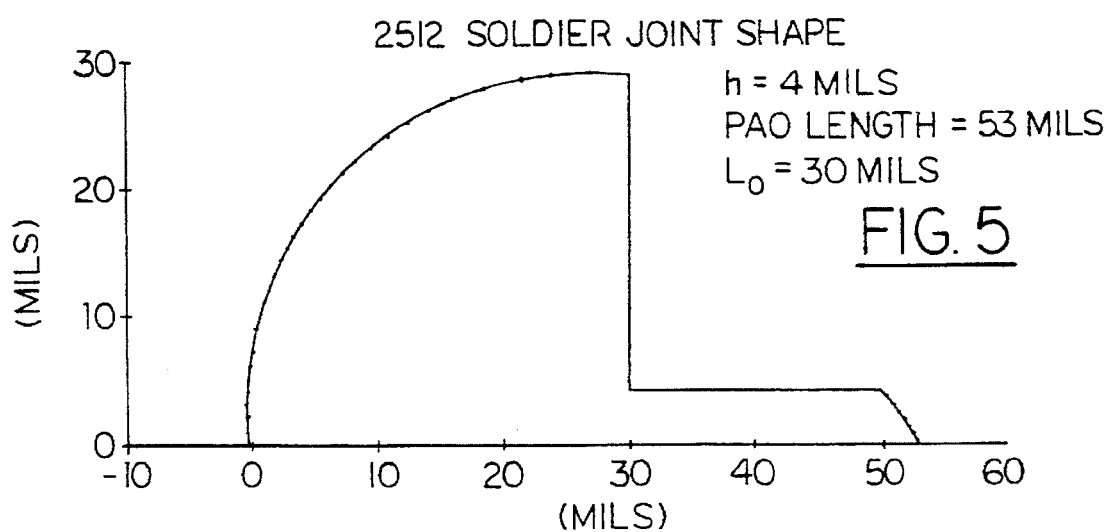
FIG. 5 is a graph showing the solder shape according to the present invention.

Referring now to FIG. 5, a plot of a typical solder quantity and shape is shown for a 2512 component. The plot shows a pedestal height of 4 mils, a pad length of 53 mils and an $l_o$, of 30 mils. Using a minimum quantity of solder as calculated using the formulas above, the solder fillet as shown is formed.

Figure 6:
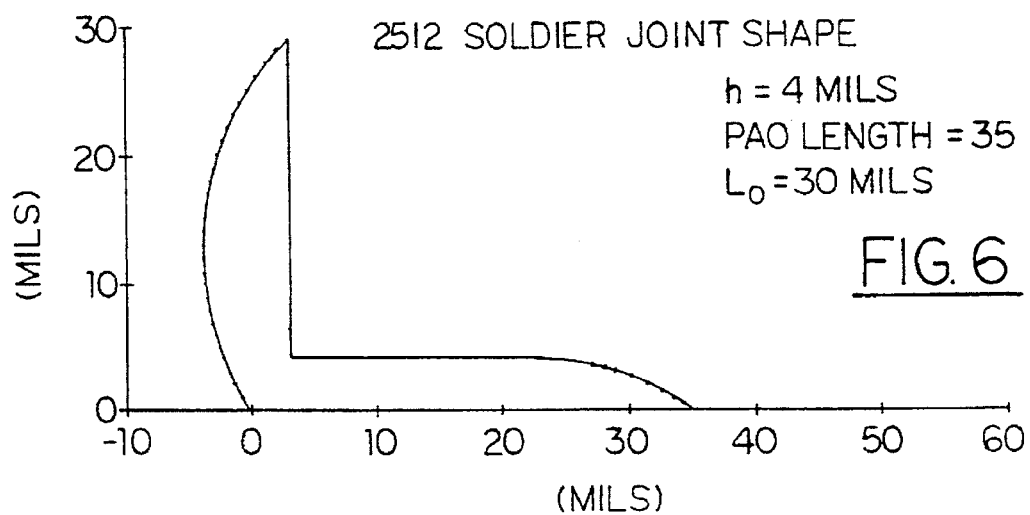
FIG. 6 is a graph showing the solder shape of another embodiment of the present invention.

Referring now to FIG. 6, the size of the pad is altered from that in FIG. 5 so that the pad length is reduced to 35 mils and the extension of the pad beyond the component, is reduced to 3 mils. As can be seen, by shortening the solder pad and shifting the position of the component, desired results are still obtained while reducing the quantity of solder applied.

As would be evident to one skilled in the art, several modifications to the invention may be made while still being within the scope of the appended claims. For example, different size components, modified pad shapes, and alternate method of applying solder can be used.

What is claimed is:

1. A method for improving the reliability of solder joints comprising the steps of:

applying a predetermined volume of solder r to at least two spaced solder pads on a circuit board;

placing a component having spaced terminals over said solder pads and onto said solder so that each pad extends beyond a terminal thereabove a controlled distance to insure that said volume of solder predetermined by the equation $V_f=0.25 \ w\{\theta_o(c_o/\sin \theta_o)^2-c_o^2 \cot \theta_o+2 \ H \ l_o\}$ floats said component when the solder is fluidized;

heating said component and said solder on said solder pads to melt the solder to effect floating said component on said solder by providing a net upward force on said component so that said component rises to a predetermined height above said solder pads; and forming a solidified solder fillet by solidifying said melted solder so that each of the terminals of a component remain said predetermined height above said circuit board and the solidified solder forms a convex shape on each solder pad.

2. The method recited in claim 1 wherein said solder is in a paste form.

3. The method as recited in claim 2 wherein the step of applying a predetermined amount of solder comprises the step of screen printing said solder in paste form.

4. The method as recited in claim 1 wherein said melted solder is of the quantity that provides a net upward force so that said component is buoyant in said melted solder.

5. The method as recited in claim 1 wherein said component has a metal terminal and a non-wetting coating deposited on an upper portion of said metal terminal.

6. The method as recited in claim 1 wherein said component has a metal terminal and a non-wetting coating deposited on a side portion of said metal terminal.

* * * * *